(12) United States Patent
Lin et al.

(10) Patent No.: US 7,084,685 B2
(45) Date of Patent: Aug. 1, 2006

(54) METHOD AND RELATED APPARATUS FOR OUTPUTTING CLOCK THROUGH A DATA PATH

(75) Inventors: Vincent Lin, Taipei Hsien (TW); Kun-Long Lin, Taipei Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 54 days.

(21) Appl. No.: 10/711,254

(22) Filed: Sep. 4, 2004

(65) Prior Publication Data

US 2005/0052212 A1 Mar. 10, 2005

(30) Foreign Application Priority Data

Sep. 8, 2003 (TW) .............................. 92124759 A

(51) Int. Cl.
*H03K 17/16* (2006.01)
(52) U.S. Cl. ...................................... 327/291; 327/294
(58) Field of Classification Search ................ 327/291, 327/294, 298, 299, 202, 211, 212
See application file for complete search history.

(56) References Cited

U.S. PATENT DOCUMENTS

| 5,045,715 A | * | 9/1991 | Fitch ........................... 327/174 |
| 5,535,343 A | * | 7/1996 | Verseput ..................... 375/359 |
| 6,115,442 A | * | 9/2000 | Lusinchi ..................... 377/47 |

* cited by examiner

*Primary Examiner*—Linh My Nguyen
(74) *Attorney, Agent, or Firm*—Winston Hsu

(57) ABSTRACT

An output clock is provided by a logic module and at least one flip-flop based on a reference clock. Each flip-flop receives the reference clock at a corresponding clock end and changes a signal level outputted at a corresponding output port according to rising or falling edges within each period of the reference clock. The logic module performs a logic operation among signals at each output port of the flip-flops to generate the output clock synchronized with the reference clock. Thereafter the output clock can be outputted through the data path provided by the logic module, and additional logical operations can be performed between the output clock and other signals.

21 Claims, 9 Drawing Sheets

METHOD AND RELATED APPARATUS FOR OUTPUTTING CLOCK THROUGH A DATA PATH

BACKGROUND OF INVENTION

1. Field of the Invention

The present invention relates to a method and a related circuit for providing an output clock, and more particularly, a method and related circuit for providing an output clock along a data path according to a reference clock.

2. Description of the Prior Art

In the information-oriented society, various kinds of data are processed, transmitted and stored rapidly and effectively in the digital mode. Digital signal circuits used to process digital signals become one of the fundamental blocks of modern information systems.

As known by those skilled in the art, digital signal circuits are triggered by clocks to process and transmit sequential digital signals and to synchronize timing of function blocks. Due to the increasing complexity of digital signal circuits, parameters and functions of circuits require more careful design. Please refer to FIG. 1 and FIG. 2. FIG. 1 and FIG. 2 illustrate conventional digital signal circuits 10 of different implementation methods. As shown in FIG. 1, to complete functions of ordinary digital signal circuits, the signal circuit 10 comprises a logic array 12, a plurality of flip-flops 14A and 14B, and a clock control circuit 16. The clock control circuit 16 generates a reference clock 18B according to a source clock 18A; the source clock 18A can be generated by the oscillator in the signal circuit 10, or be fed by other oscillation circuits outside the signal circuit 10. Each flip-flop 14A, 14B comprises an input port 13A, an output port 13B, and a clock port 15. Input port 13A receives input signals (as two different input data from two input ports), clock port 15 receives the triggering signal, and the flip-flops 14A, 14B, triggered by clocks of clock port 15, change output signals of output port 13B according to signals of input port 13A (as two different output data of two output ports). The rising edge of the clock signal from clock port 15 triggers flip-flop 14A, leading to data transition in the output signals of output port 13B while the falling edge of the clock signal from clock port 15 triggers flip-flop 14B, resulting in data transition in the output signals of output port 13B. The logic array 12 comprises several kinds of logic gates, such as AND gate 19A and OR gate 19B in FIG. 1. Proper connection of input ports/output ports of flip-flops 14A and 14B as well as logic gates of logic array 12 facilitates implementation of different functions of digital signal circuits, such as adders, timers, state machines, etc. In addition, the signal circuit 10 comprises a plurality of output pads 22. For example, the signal circuit 10 can be enclosed in a package, with each output pad 22 being a pin extending outside the package. Thus, output signals of logic gates in logic array 12 or flip-flop output ports can be sent outside the signal circuit 10 by theses output pads 22. Output ports of the flip-flops and outputs of the logic gates in the logic array 12 are taken as data paths of output signals of the signal circuit 10, and each output port becomes a transmission medium of a data path of the signal circuit 10.

Relative to the data path, the transmission path, through which the clock control circuits 16 is connected to each clock port of the flip-flop is called a clock path. As the mentioned before, to align the timing of the flip-flops 14A and 14B, both flip-flops 14A and 14B should be triggered by reference clock 18B. In other words, to consider the logic function only, clock ports 15 of flip-flops 14A and 14B should be connected to control circuits 16 directly, as shown in FIG. 1. When all flip-flops are triggered by the reference clock 18B, output signals of these flip-flops will start data transition simultaneously. Since signals in the data path and the reference clock in the clock path are synchronous in logic, they can be used in logical operations, so that signals in the data path can change according to the reference clock 18B. As shown in FIG. 1, a signal 20 can undergo an OR operation with reference clock 18B by the OR gate 19B and signals in the data path of output of the OR gate 19B will relate to the reference clock 18B.

However, including the non-ideal effects of actual circuits, the signal circuit 10, as shown in FIG. 2, should include a buffer 24 in front of each flip-flop to which the clock 18B is transmitted so that the rising edge or the falling edge of clock signals transmitted to clock ports 15 of flip-flops 14A and 14B can actually trigger each flip-flop at the same time. When the digital circuit is operating, flip-flops 14A and 14B are equivalent to a capacitive load of clock control circuits 16. Considering the branches 26A to 26C of the clock path shown in FIG. 2, there are three flip-flops in branch 26A, four flip-flops in branch 26B, and two in branch 26C. The capacitive load of branch 26B is the largest, and that of branch 26C is the smallest. If flip-flops in these two branches are driven by clocks of the same strength, the clock transmitted to branch 26B becomes late when it compared to the clock transmitted to branch 26C. The clock of branch 26B is delayed because the larger capacitive load of branch 26B increases the charging or discharging time. Therefore, as shown in FIG. 2, more buffers 24 (or buffers with stronger driving ability) should be connected in branch 26B to increase the driving strength of the clock and overcome the non-ideal operation caused by larger capacitance so that timing of clocks triggering each flip-flop is correct.

To consider the non-ideal nature of actual digital signal circuits, time response of flip-flops triggered by clocks should be considered besides adjusting the driving ability of each clock path of the reference clock 18B. As for this situation, please refer to FIG. 3. FIG. 3 illustrates a timing diagram of input/output signals of a conventional rising-edge-triggered flip-flop 14 when the flip-flop 14 is triggered by the reference clock 18B. The flip-flop 14, triggered by the reference clock 18B, receives a signal 28A from one input port (marked as D in FIG. 3) and outputs a signals 28B from one output port (marked as Q in FIG. 3). FIG. 3 plots waveforms of signals 28A, 28B and signal level of reference clock 18B versus time; the x-axis represents time and the y-axis represents magnitude of waveform level. As shown in FIG. 3, when the reference clock 18B triggers the flip-flop 14 at rising edges at time points tp0, tp1, tp2 and tp3, the flip-flop 14 will sample different levels of signals 28A at these time points and change waveform levels of the corresponding output signal 28B. Thus, signal levels of the output signal 28B at time points tp0, tp1, tp2 and tp3 equal waveform levels of input signal 28A at these time points. For example in FIG. 3, levels of signal 28A at time points tp0, tp1, tp2 and tp3 are H, H, H, and L, respectively, so signal levels of output signal 28B at these time are H, H, H and L. However, in the real case, to make sure that flip-flops 14 are able to sample the stable level of input signal 28A according to triggering of the rising edge of reference clock 18B, data transition of signal 28A should be earlier than the rising edge of reference clock 18B. For example, as shown in FIG. 3, if the flip-flop 14 is required to sample level H of input signal 28A at time tp0, the data transition of input signal 28A, from level L to level H, should be at time as early as time tpA. In other words, there needs to be a time between data transition of input signal 28A and rising edge of clock 18B, and this time is called the set-up time.

After rising edge of reference clock 18B occurs, the input signal 28A at least maintains its level for a period of time so that the flip-flop 14 can sample data correctly; the time for which the signal 28A maintains its level after the rising edge is called the hold time. For example, in FIG. 3, the flip-flop 14 samples data at time tp2, and data transition of the input signal 28A occurs until time tpB so that the flip-flop 14 can stably sample the level of signal 28A at time tp2. In summary, in designing the signal circuit 10, besides considering the correct logic operation of the signal circuit 10 in FIG. 1, the actual operation in FIG. 2 should also be considered. This operation in FIG. 2 includes properly fine-tuning the driving strength of the clock in each branch of the clock path, and inducing a period of time between data transition of input signals of flip-flops and rising edges (or the falling edges) of clocks (the period of time can be fine-tuned by delay of buffers). Today, functions of digital signal circuits have become more complicated, so circuit designs in FIG. 1 and FIG. 2 are assisted and implemented by software tools and computers. The logic design of FIG. 1 can be simulated by programming languages, such as VHDL; the clock design of FIG. 2 can be aided by a tool such as a "clock tree synthesizer".

As mentioned before, the signal circuit 10 is required to do logical operations between reference clock 18B and signal 20 by logic gates in logic array 12 so that data in the data path of logic array 12 relate to reference clock 18B. As shown in FIG. 1 and FIG. 2, reference clock 18B performs a logic operation with signal 20 in logic gate 19B. However, to consider actual operation of digital signal circuits, there should be a proper period between the time when data transition of signals in each data path occurs and the time when rising edge (or the falling edge )in reference clock 18B occurs. If the reference clock 18B in the clock path and the signals in the data path undergo logic operations directly, logic operations between the time of two data transitions may not be as expected, resulting in distortion in a logic operation. In addition, when a software tool such as a "clock tree synthesizer" assists in the design of the signal circuit 10, this tool can neglect adjusting the driving ability of the reference clock 18B in the branch of logic gate 19B because the reference clock 18B is directly input to the logic gate 19B. The clock tree synthesizer will recognize signals connected to each clock port of the flip-flops as a clock and automatically adjust the ability and delay of the clocks, but the tool cannot recognize signals input to the logic gate 19B as a clock, so the driving ability and delay of the reference clock 18B directly input into the logic gate 19B cannot be adjusted automatically. This causes rising edges or falling edges of the clock in the branch of the logic gate 19B and those of input clocks of flip-flops in the branches 26A to 26C to not occur at the same time.

In addition, as known by those skilled in the art, to check if the logic design of the signal circuit 10 can implement the desired functions, the signal circuit 10 can be simulated by computers. Logic design in FIG. 1 is to examine the functions of the signal circuit 10. However, in simulation of logic functions, the clocks of the flip-flops are assumed to be synchronous. No matter how high the capacitive load in the branches of flip-flops, a simulation assumes rising edges and falling edges of clocks in each clock port of flip-flops to happen at the same time because the purpose of the simulation is to simulate the logic function. However, if the logic gate 19B performs an operation directly on the reference clock 18B and the signal 20, the simulation will not take reference clock 18B input to the logic gate 19B as the clock of the flip-flops, but recognize the reference clock 18B input to the logic gate 19B as output signals of the clock control circuits 16. Thus, the simulation tool considers that the reference clock 18B input into the logic gate 19B and the clock of each clock port of the flip-flops are not synchronous, leading to failure of a correct simulation and increasing difficulty of logic function confirmation of the signal circuit 10.

In summary, in the signal circuit 10, there are often logic operations between the reference clock and other signals, so that results of logic operations directly relate to timing of the reference clock. Even in some special circuits, such as a field programmable gate array, the clock cannot be output directly from output pads, but through a data path of a logic array and flip-flops. However, as discussed before, in the prior art, if the clock in the clock path directly performs logic operations, there will be much difficulty in operation and design of the circuits, so it is difficult for circuit designers to control clocks after logic operations.

Besides, in modern digital signal circuits, signals are often exchanged between circuits of different frequencies. Please refer to FIG. 4. FIG. 4 illustrates each relative signal in a signal circuit 30 when a signal 36 is transmitted between two circuit modules 32A and 32B of different clocks. In the signal circuit 30, the circuit module 32A is working with the clock 34A, and the circuit module 32B is working at a clock 34B, whose frequency is twice that of the clock 34A. In the prior art, when the circuit module 32A transmits the signal 36 to the circuit module 32B, the circuit module 32B transforms the signals 36 to a signal 38 and finally produces a signal 40 so that circuit module 32B can recognize the signal 36. FIG. 4 illustrates a waveform-timing diagram of these related signals. The x-axis represents time, and the y-axis represents magnitude of signal level. In the example of FIG. 4, because the frequency of the clock 34B of the circuit module 32B is double that of the clock 34A of the circuit module 32A, the period of clock 34A is twice of that of the clock 34B. As shown in FIG. 4, one period of the clock 34A between time points tp4 and tp6 equals two periods of clock 34B between time points tp4 and tp5 and between time points tp5 and tp6. Triggered by the clocks, the signals of each circuit module correspond to periods of these circuit modules. As in the example of FIG. 4, in the circuit module 32A, the signal 36 between time points tp4 and tp6 (corresponding to a period of clock 34A) maintains a level H, and is taken as digital data "1". Similarly, the signal 36 between time points tp6 and tp8 (corresponding to another period of the clock 34A) maintains a level L, and is taken as a digital data "0".

When the circuit module 32A transmit signal 36 to the circuit module 32B which has double the frequency, signals 36 should be processed and transformed properly due to different working frequencies of the two circuit modules so that the circuit module 32B reads data of the signal 36 correctly. Without transforming the signal 36, the circuit module 32A working in the double frequency will recognize one digital data "1" of signal 36 corresponding to the clock 34A as two digital data "1" corresponding to clock 34B thereby misreading the data in signal 36. The method of transforming data in the signal 36 according to the prior art is described as follows. In the prior art, after the circuit module 32B receives the signal 36, the signal 38 can be produced according to the signal 36 if rising-edge-triggered flip-flops are triggered by the clock 34B. This delays signal 38 for a period of clock 34B in comparison with signal 36.

Then, signal 36 undergoes an AND operation with inversion of the signal 38 and the signal 40 is generated. Thus, the signal 40 will keep the level H for the time between points tp4 and tp5 corresponding to a period of clock 34B. Therefore the circuit module 32B is able to recognize the data as one digital data "1". In other words, there is one digital data "1" of the signal 36 in clock 34A, and after the signal 36 is transformed to the signal 40, the signal 40 corresponding to the clock 34B will have one digital data "1". After the signal 36 of the circuit module 32A is transformed to the signal 40, it can be recognized correctly by the circuit module 32B working at double the frequency.

However, there are some disadvantages in the prior art described above. Circuits made in accordance with the prior art cannot process burst data. Regarding this situation, please refer to FIG. 5. FIG. 5 illustrates waveform timing diagrams of each relative signal when the two circuit modules 32A and 32B of the digital circuit 30 in FIG. 4 transmit a signal 42. The x-axis represents time, and the y-axis represents magnitude of waveform. As shown in FIG. 5, signal 42 in the circuit module 32A continuously keeps at a level H during time points tp9 to tp11 (corresponding to two periods of clock 34A). The signal is equivalent to two continuous digital data "1". If, in prior art, flip-flops are triggered by the clock 34B to produce the signal 46, and inversion of the signal 46 undergoes an AND operation with the signal 42 to output a signal 48, there is still one digital data "1" corresponding to one period of the clock 34B in the signal 48. In other words, the data transmitted from the circuit module 32A to the circuit module 32B cannot be burst data according to the method of the prior art. This decreases the efficiency of data transmission between the two circuit modules.

SUMMARY OF INVENTION

The claimed invention provides a clock circuit for generating an output clock in a data path according to a reference clock, in which there are signals of a plurality of periods, each period of the signals having one rising edge and one falling edge. The clock circuit comprises a first flip-flop having a first clock port, wherein the first flip-flop generates a first signal according to triggering of a reference clock on the first clock port, the first flip-flop changing a level of the first signal when each rising edge of the reference clock occurs; a second flip-flop having a second clock port, wherein the second flip-flop generates a second signal according to triggering of the reference clock on the second clock port, the second flip-flop changing a level of the second signal when each falling edge of the reference clock occurs; and a logic module for performing a logic operation on the first signal and the second signal to generate the output clock.

These and other objectives of the present invention will no doubt become obvious to those of ordinary skill in the art after reading the following detailed description of the preferred embodiment that is illustrated in the various figures and drawings.

DETAILED DESCRIPTION

In the present invention, a logic operation is performed on output signals of flip-flops that change with triggering of a reference clock, and an output clock is produced in a data path formed by the flip-flops and a logic gate. The output clock is synchronous with the reference clock and can be applied to the data path so that this clock can undergo a logic operation with signals in other data paths. Because the output clocks of the present invention are produced from outputs of flip-flops, the correct result is obtained to simulate the logic functions. As a result, a software tool known as a "clock tree synthesizer" can adjust the driving ability of each clock as usual so that synthesized digital signal circuits work in the expected manner.

In addition, the output clock of the present invention can perform a logic operation in the data path with other signals correctly, so the logic operation of the present invention can be applied to synchronous processing of data and clocks. For example, when signals are transmitted between two circuit modules of different frequencies, the signals can undergo a logic operation with output clocks produced by circuits of the present invention. Therefore circuit modules of different clocks can transmit and recognize burst data correctly.

Figure 1:
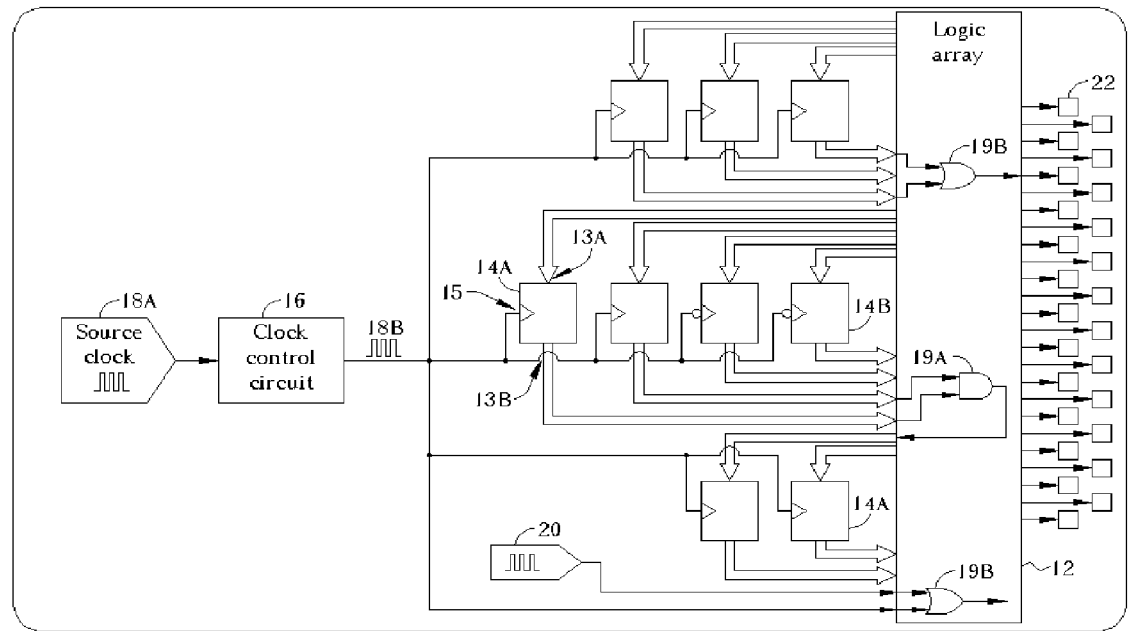
FIG. 1 and FIG. 2 illustrate function blocks of a conventional signal circuit in different stages of circuit design.
Figure 2:
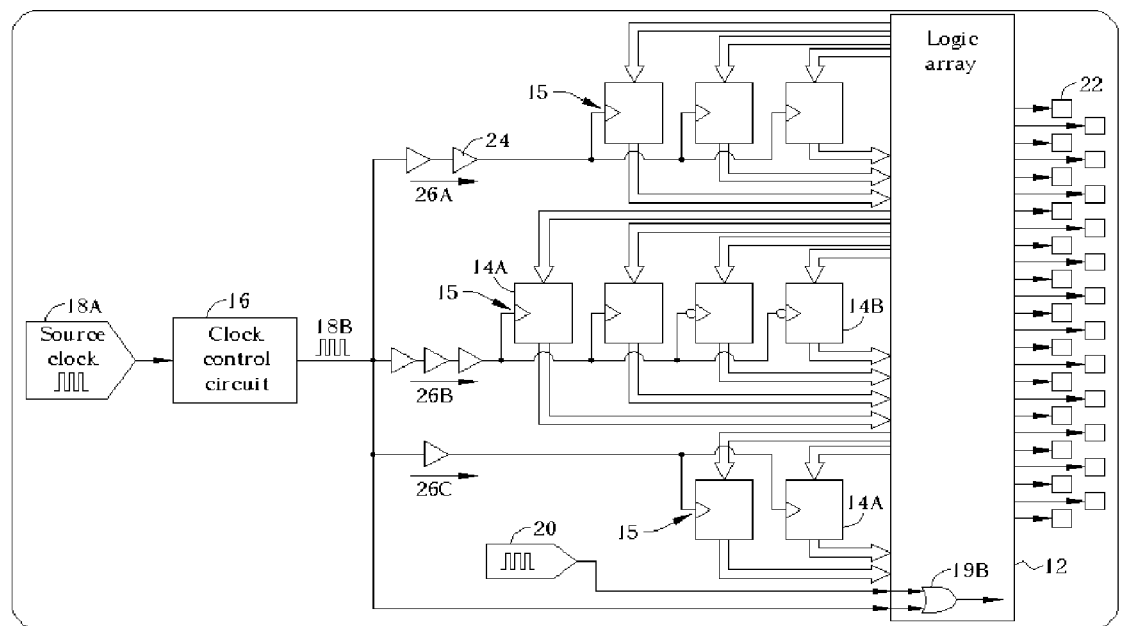
Figure 3:
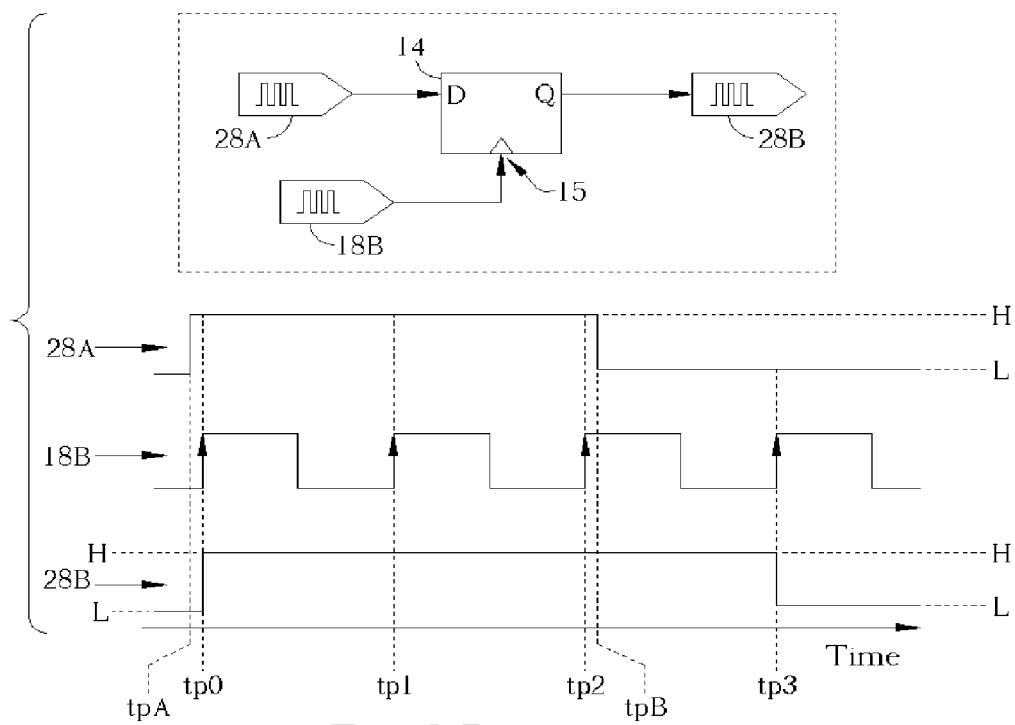
FIG. 3 illustrates an input/output signal waveform-timing diagram of a conventional flip-flop triggered by clock.
Figure 4:
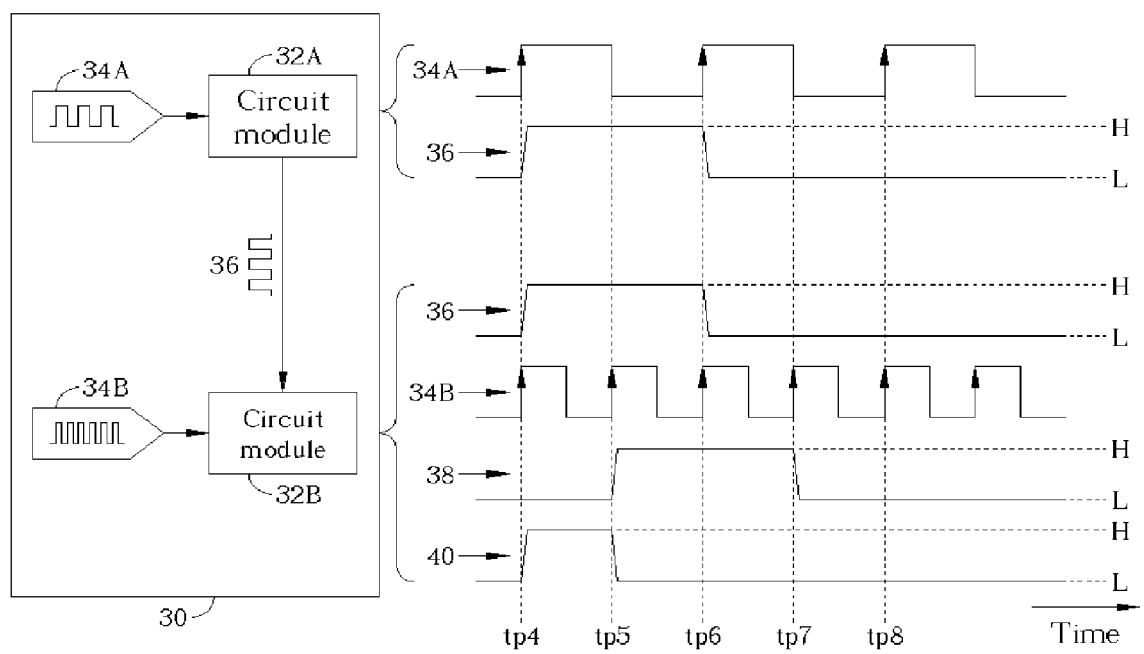
FIG. 4 and FIG. 5 illustrate signal waveform-timing diagrams in which signals are transmitted between two circuits operating under different clocks in the prior art.
Figure 5:
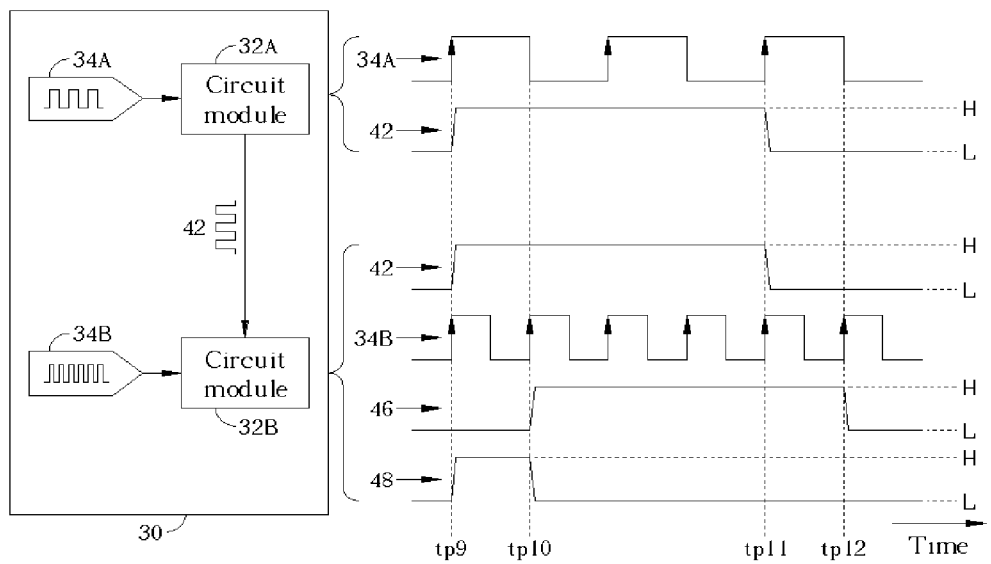
Figure 6:
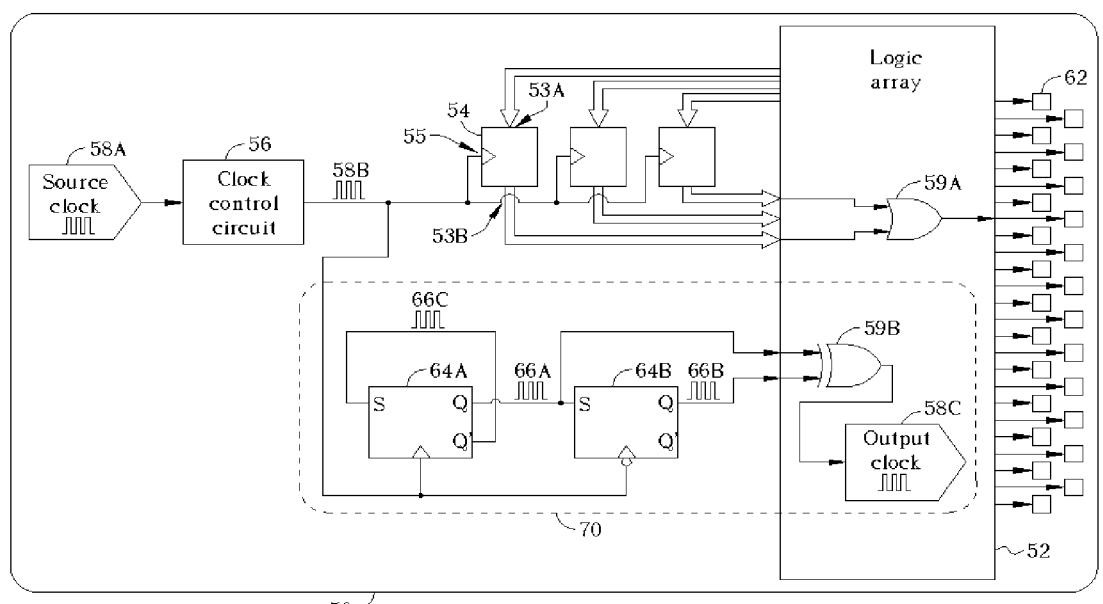
FIG. 6 is a function block diagram in which the signal circuit in the present invention generates an output clock in a data path.

Please refer to FIG. 6. FIG. 6 illustrates function blocks of a digital signal circuit 50 of the present invention. Similar to the conventional digital signal circuit, the signal circuit 50 of the present invention comprises a clock control circuit 56, a plurality of flip-flops 54, 64A and 64B, and a plurality of logic gates in a logic array 52 (including OR gate 59A and XOR gate 59B further shown in FIG. 8). The clock control circuit 56 generates a reference clock 58B according to a source clock 58A and can control signal waveforms of the reference clock 58B. For example, when the signal circuit 50 is required to operate in a power-saving mode, the clock control circuit 56 can lower the frequency of the reference clock 58B, or keep the reference clock 58B at a fixed level. Each flip-flop 54 has the same basic structure including a clock port 55 so that signals of an output port 53B are changed according to signals of an input port 53A when these flip-flops are triggered by rising edges or falling edges of the clock from the clock port 55. The clock port of each flip-flop is triggered by the reference clock 58B to align operation timing of each flip-flop. Similarly, outputs of each flip-flop as well as output/inputs of logic gates of the logic array 52 form the data path of the signal circuit 50. The reference clock 58B controls operation timing of each flip-flop through clock paths connected to each clock port of the flip-flops. Various functions of digital signal circuits are implemented by the combination of each flip-flop and each logic gate of the logic array 52, and signals are output from the plurality of output pads 62 of the signal circuit 50.

Figure 8:
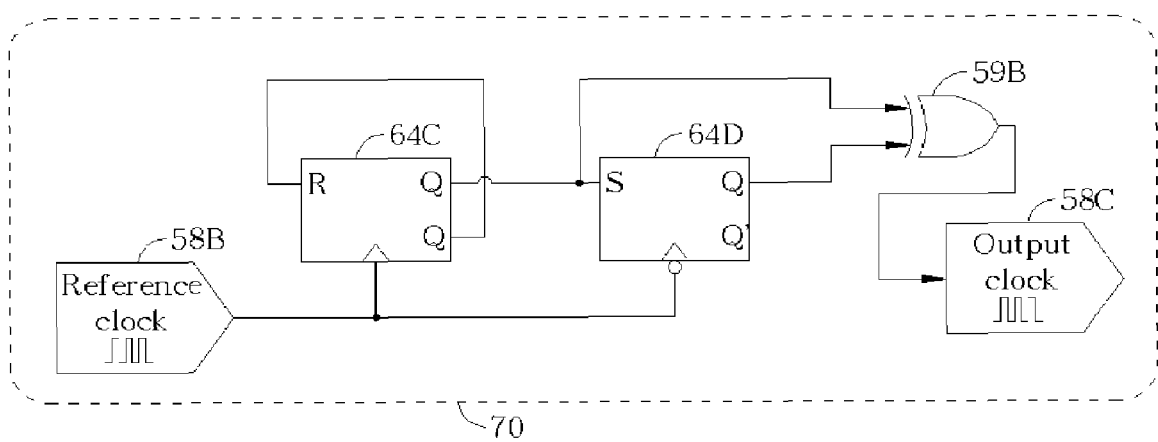
FIG. 8 illustrates function blocks of another embodiment of the clock module in FIG. 8.

To achieve one purpose of the present invention, that of the data signals synchronously changing with reference clock 58B are produced in the data path to be an output clock, the two flip-flops 64A, 64B and the one XOR gate 59B are used to implement a clock module 70 of the present invention. As shown in FIG. 8, in the clock module 70, which serves as a clock circuit, the flip-flops 64A, 64B are triggered by the reference clock 58B through the clock path. Each of the flip-flops 64A and 64B has one input (as marked S in FIG. 6), and each of these flip-flops has two outputs in which one is the inversion of the other (as shown as Q and Q' in FIG. 6). Because the flip-flop 64A is a rising-edge-triggered flip-flop, if input S samples a digital data "1" at the rising edge of clock 58B, output ports Q and Q' will send out digital data "1" and "0" respectively, and if input S samples a digital data "0", output ports Q and Q' will send out digital data "0" and "1" respectively. The flip-flop 64B is a falling-edge-triggered flip-flops, so if input S samples a digital data "1" at the falling edge of clock 58B, the output ports Q and Q' will send out digital data "1" and "0" respectively, and the other situation is analogous. In the clock module 70, the output signal 66C of the flip-flop 64A at output port Q' is directly connected to its input port S, and the output port Q produces signals 66A. The signals 66A will be transmitted to the input port S of the flip-flop 64B, and then the output port Q of the flip-flop 64B, triggered by a falling edge of the reference clock 58B, will generate signals 66B. If the XOR gate 59B serves as a logic module and the signals 66A and 66B are input to the XOR gate 59B to undergo an XOR operation, the signals synchronously change with the reference clock 58B, and an output clock 58C will be generated in the data path of the signal circuit 50.

Figure 7:
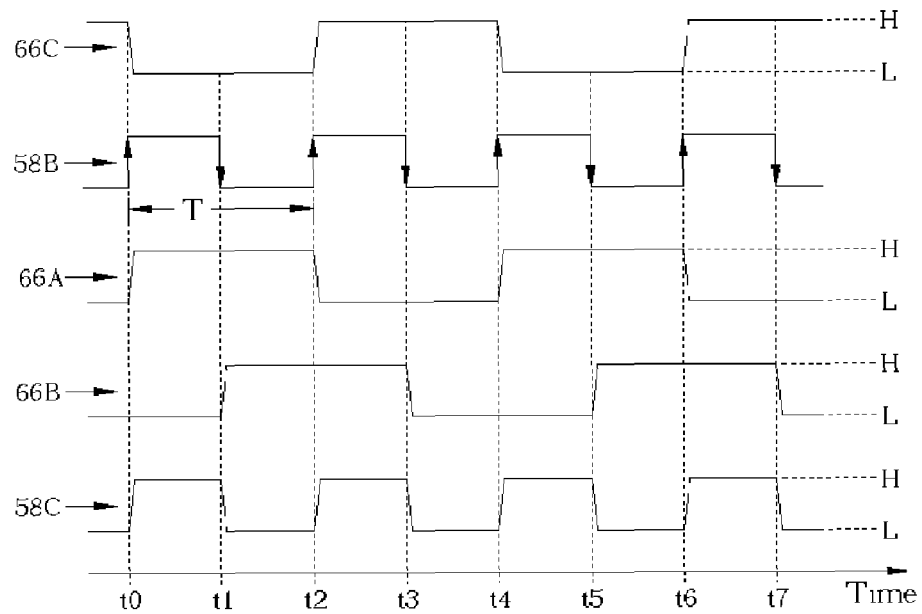
FIG. 7 illustrates signal waveform-timing diagrams of the signal circuit in FIG. 8 operating.

As for operation of the clock module 70, please refer to FIG. 7 (also refer to FIG. 6). FIG. 7 illustrates waveform-timing diagrams of each signal when the clock module 70 operates. The x-axis represents time and the y-axis represents levels of signal wave. From top to bottom in FIG. 7, the signals are the signal 66C of flip-flop 64A at output Q', the reference clock 58B, the signals 66A and 66B of flip-flops 64A and 64B, and waveforms of the output clock 58C. The period of the reference clock 58B is T, and the waveform of the reference clock 58B inside one period shows one rising edge and one falling edge. As shown in FIG. 7, if signal levels of the flip-flop 64A at outputs Q and Q' are digital "0" and "1", which represent a low level L and a high level H respectively, before and at time point t0, the rising edge of the reference clock 58B is a level H, digital data "1" of signal 66C, so that the output signal 66A of the flip-flop 64A rises to a level H, and the signal 66C from the output Q' decreases to the level L. When the rising edge of the reference clock 58B occurs at time t2, flip-flop 64A samples a level L of signal 66C and then the signal 66A of the flip-flop 64A at output Q changes to a level L, so the signal 66C of the output Q' changes to a level H. The remaining situations are analogous. Thus, each rising edge of the reference clock 58B (such as the rising edges occurring at time points t0, t2, t4, and t6) will trigger the signals 66A and 66C to change once between the level H and the level L. Similarly, the flip-flop 64B which has input signal 66A will trigger the signal 66B to change its level once when the falling edge of the clock 58B occurs at time points t1, t3, t5, and t7. After the XOR gate 59B performs the XOR operation on signals 66A and 66B, the produced output clock 58C is shown in FIG. 8. As shown in FIG. 7, the output clock 58C changes synchronously with the reference clock 58B. In other words, output clock 58C is equivalent to the clock in the data path.

As discussed before, there is often a need to perform logic operations between clocks and signals in a data path of a digital signal circuit. However, in the prior art, logic operations are directly performed between clocks and signals in the data path, and this results in difficulty of design and operation of the digital signal circuit. In the present invention, one can use the clock module 70 to generate data signals, the output clock 58C, synchronously changing with the reference clock 58B in the data path (that is, output of the flip-flops and output of logic array logic gate). When the clock is to undergo logic operations with other signals in the data path, the output clock 58C in the data path can serve as the clock to operate with the other signals. Because the output clock 58C is generated in the data path, when the signal circuit 50 simulates logic functions, the reference clock 58B will not be used in the logic operation in the logic gate with the other signals. Thus, unlike the prior art, in which the clock in the clock path is mixed into the data path, simulation of logic function can be completed easily. Similarly, in doing clock tree synthesis, the reference clock 58B will not be connected to a logic gate, by will be connected to clock ports of the flip-flops 64A and 64B instead. Thus, a clock tree synthesizer software tool can fine-tune the driving ability and delay times of branches of the flip-flops 64A and 64B normally.

Please refer to FIG. 8. FIG. 8 is another embodiment of the clock module 70 in FIG. 6. The clock module 70 in FIG. 8 comprises flip-flops 64C and 64D, and one XOR gate 59B. According to triggering of the flip-flops by the reference clock 58B, data signals synchronously changing with the reference clock 58B are produced in the data path to become the output clock 58C. Similar to the embodiment shown in FIG. 6, the flip-flops 64C and 64D are rising-edge-triggered and falling-edge-triggered flip-flops respectively, and an input R of the flip-flop 64C receives feedback from an output Q. When the flip-flop 64C operates, if the input R of the flip-flop 64C samples a digital data "1" in the rising edge of the reference clock 58B, the outputs Q and Q' will be digital "0" and "1", respectively; otherwise, if the input R samples a digital data "0", the outputs Q and Q' will be digital "1" and "0", respectively. Operational principles of the clock module 70 in FIG. 8 are the same as those of the clock module 70 in FIG. 6. Those skilled in the art can easily deduce the operation, so it will not be described further.

Data signals (output clock 58C) in the data path equivalent to the circuit clock generated by the clock module 70 in the present invention have many applications. The simplest application is to output the clock 58C from output pads 62 of the signal circuit 50. However, in some specific circuits, such as field programmable gate arrays, the clock in the clock path cannot be directly output from output pads. In this situation, these specific circuits can be made following principles of the present invention and generate data signals equivalent to a clock. Then, these data signals can be output from output pads as a circuit clock. For example, in a micro-processing system, if a controller of a memory (such as static random-access memory) is to be implemented by a field programmable gate array, the clock module in the present invention can be implemented by the field programmable gate array, and output signals of the controller are equivalent to a clock controlling timing of data-reading or data-writing of the memory.

Figure 9:
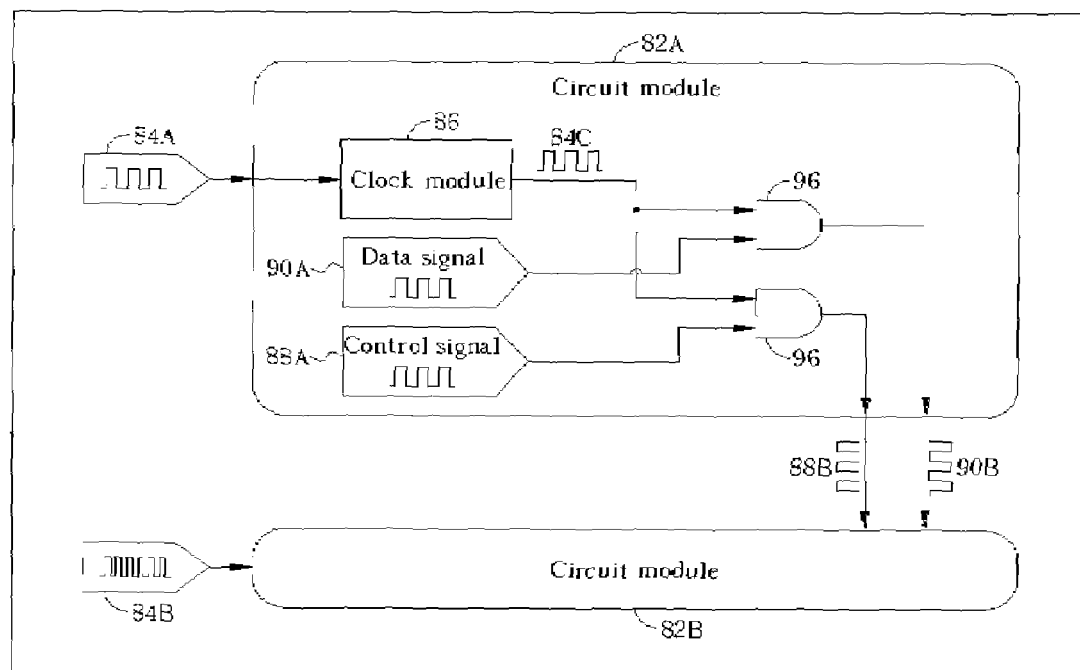
FIG. 9 illustrates function blocks of signals transformed between two circuit modules of different frequency in one signal circuit of the present invention.

In addition, because the output clock generated by the clock module in the present invention can undergo logic operations with other signals in the data path, the output clock can also be used for signal processing. For example, when in a signal circuit two circuit modules with different clocks send signals to each other, the output clock of the present invention is used to control transmitted signals. As for this situation, please refer to FIG. 9. FIG. 9 illustrates that two circuit modules 82A and 82B working with different clocks 84A and 84B in a digital signal circuit 80 take advantage of the clock module of the present invention to process signals. In the signal circuit 80, the circuit module 82A works with the clock 84A, while the circuit module 82B works with the clock 84B, whose frequency is double that of the clock 84A. In order to process signals sent by the circuit module 82A correctly in the circuit module 82B, a clock module 86 (similar to the clock module 70 in FIG. 6 or FIG. 8) can be implemented in the circuit module 82A according to the method of the present invention so that data signals, such as output clock 84C, equivalent to the clock 84A are generated in the data path. As for data signals 90A to be transmitted from the circuit module 82A to the circuit module 82B, their effective data delay time can be decided by a corresponding control signal 88A. Two AND gates 96 implement a logical AND operation among the signal 90A, the control signal 88A, and the output clock 84C, and generate a signal 90B and a control signal 88B respectively. With the control signal 88B, the circuit module 82B can process the data of the signal 90B correctly.

Figure 10:
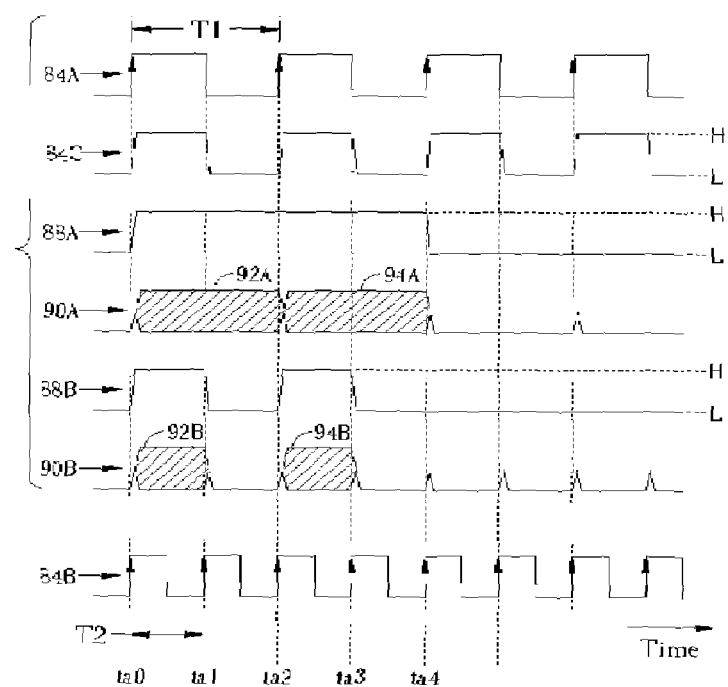
FIG. 10 is signal waveform-timing diagram of the signal circuit in FIG. 9.

Regarding the operation of the circuit in FIG. 9, please refer to FIG. 10. FIG. 10 illustrates waveform-timing diagrams of signals in the signal circuit 80 in FIG. 9. The x-axis represents time and the y-axis represents waveform levels of signals. As shown in FIG. 10, a period of the clock 84A having normal timing in the trigger circuit module 82A is T1, but the circuit module 82B works with the clock 84B having double the frequency and a period T2, and thus the period T2 is half the period T1. According to the clock 84A, the clock module 86 implemented by the method of the present invention can generate the corresponding output clock 84C in the data path. Under triggering of the clock 84A, suppose that the signal 90A in the circuit module 82A has two successive data 92A and 94A corresponding to one period T1 during time ta0 to ta4, and these are to be sent to the circuit module 82B. According to the two data in the signal 90A, the circuit module 82A makes the control signal 88A maintain a level H (or digital "1") during time ta0 to ta4 (the remaining time is level L), and the signal of level H indicates the continuation time of data 92A and 94A. Performing the AND operation among the signal 90A, the control signal 88A, and the output clock 84C with the AND gate 96 forms the data signal 90B and the control signal 88B. The two data 92A and 94A of the signal 90A become data 92B and 94B of signal 90B after this AND operation. From FIG. 10, because periods of the output clock 84C during time ta1 to ta2 and time ta3 to ta4 show a level L, or digital "0", the data 92A and 94A corresponding to one period T1 become data 92B and 94B corresponding to half of the period T1 in the signal 90B after the output clock 84C and the data signal 90A have undergone the AND operation. Data 92B and 94B can be taken as sub-data of data 92A and 94A and correspond to one period T2 of clock 84B. Thus, what corresponds to data 92A and 94A in data signals 90B during time ta1 to ta2 and time ta3 to ta4 becomes sub-data of digital "0" after the AND operation. Similarly, control data 88B will maintain a level H during continuation of data 92B and 94B after the AND operation to indicate the continuation time of effective data (data 92B and 94B) in the signal 90B. Because the continuation time of the data 92B and 94B in the signal 90B corresponds to one period T2 of the clock 84B, the circuit module 82B operating with the clock 84B defines data during time ta0 to ta1 and time ta2 to ta3 correctly as one data, assisted by the control data 88B. In other words, in the signal circuit 80, the output clock 84C generated by the method of the present invention can undergo a logic operation with the signal 90A and the control signal 88A, and circuit modules operating with different clocks can process and transform different signal formats in order to make these signals be read correctly. Please notice that in the example of FIG. 10, both the data 92A and 94A in the signal 90A and signals maintaining two periods T1 during time ta0 to ta4 in the control signal 88A are burst data. In other words, even if the circuit module 82A transmits burst data to the circuit module 82B, the circuit in FIG. 9 of the present invention can process burst data correctly. In comparison, the previously-discussed prior art cannot process burst data.

Figure 11:
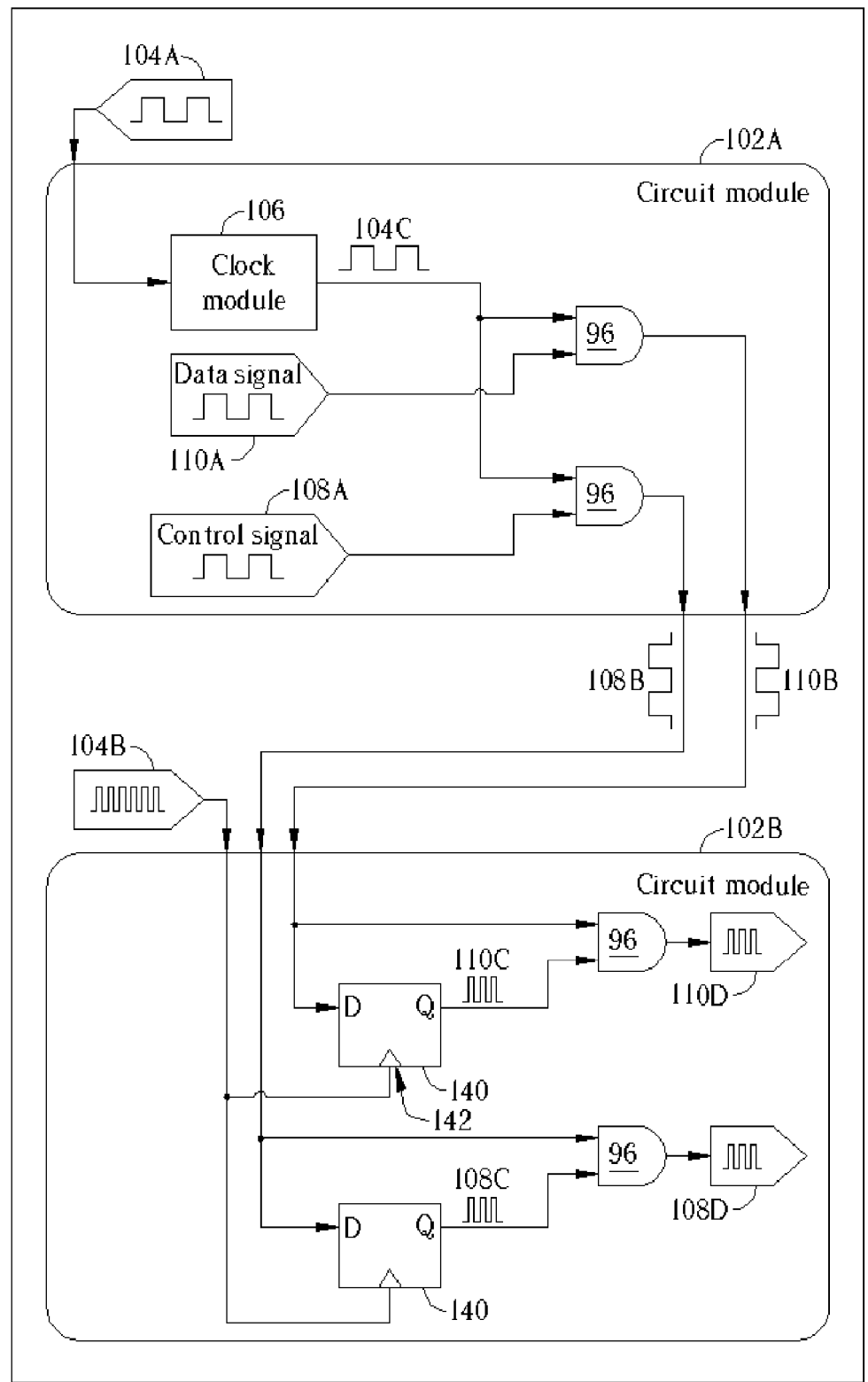
FIG. 11 illustrates function blocks of signals transformed between two circuit modules of different frequency in another signal circuit of the present invention.
Figure 12:
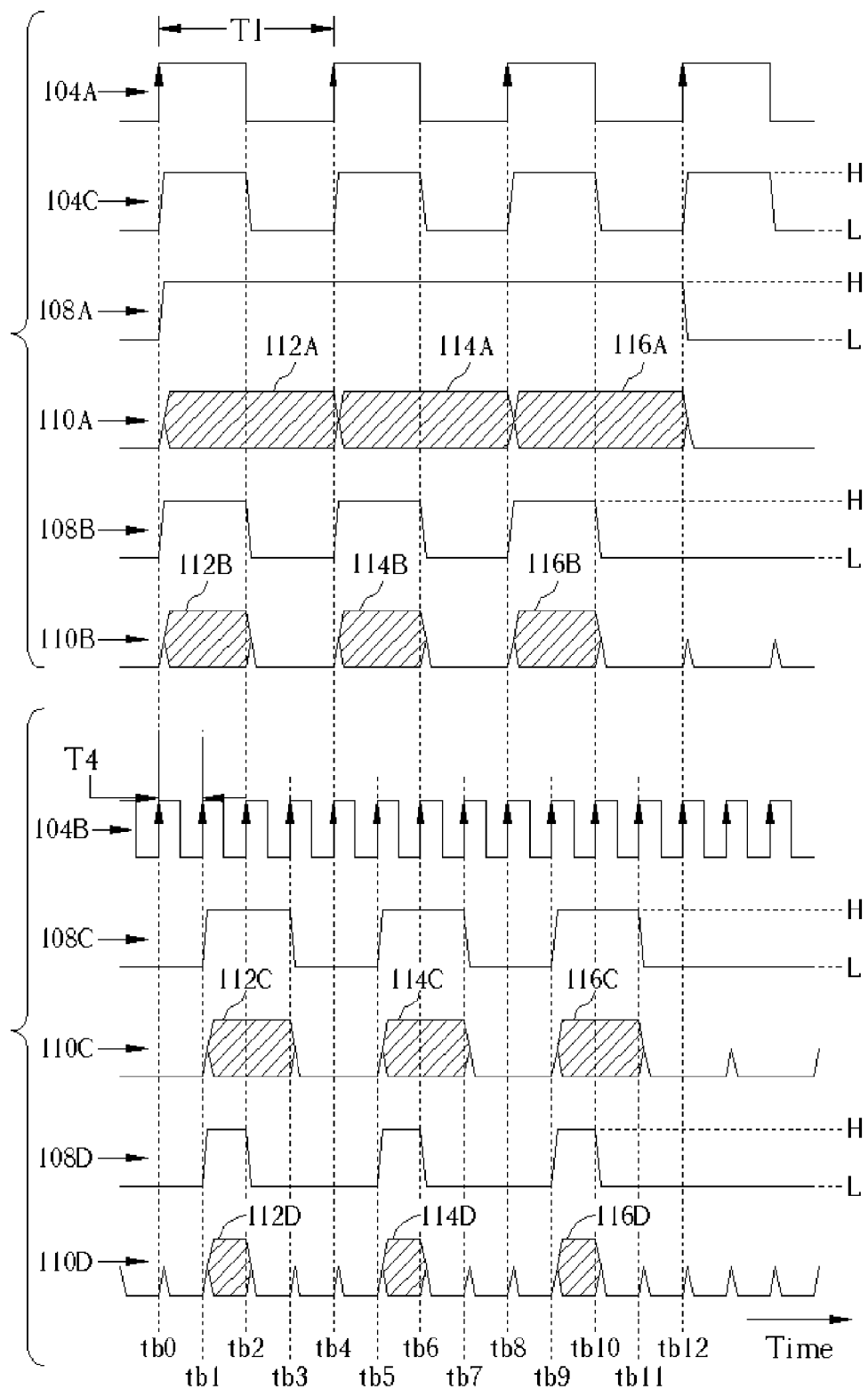
FIG. 12 is signal waveform-timing diagram of the signal circuit in FIG. 11.

Please refer to FIG. 11 and FIG. 12. FIG. 11 illustrates that in another signal circuit 100 of the present invention, two circuit modules 102A and 102B with clocks of different frequency process signals. FIG. 12 illustrates FIG. 11 waveform-timing diagram of signals in FIG. 11. The x-axis of FIG. 12 represents time, and the y-axis represents signal level. In FIG. 11, the signal circuit 100 has circuit modules 102A and 102B operating with clocks 104A and 104B respectively. The frequency of the clock 104B is four times as much as that of the clock 104A. Though the clocks of the two circuit modules have a factor of four frequency difference, data signals 110A transmitted from the circuit module 102A to the circuit module 102B can be processed correctly by the method of the present invention. The clock module 106A generates a corresponding output clock 104C first in the data path according to the clock 104A. Then the signal 110A and its corresponding control signal 108A undergo an AND operation with the output clock 104C through the AND gates 96, generating the data signal 110B and the control signal 108B. After the circuit module 102B receives the data signal 110B and the control signal 108B, flip-flops 140 (having inputs marked D, outputs marked as Q, and clock ports 142) generate a data signal 110C and a control signal 108C according to triggering of the clock 104B. The data signals 110B and 110C and the control signals 108B and 108C undergo an AND operation at the AND gates 96 and generate data signals 110D and control signals 108D in which there is correct information, corresponding to data signal 110A, processed easily by the circuit module 102B with four times frequency.

As shown in FIG. 12, the period of the clock 104A triggering the circuit module 102A to operate is T1. The period of the clock 104B, having four times the frequency and triggering the circuit module 102B to operate is T4. In other words, one period T1 corresponds to four periods T4. Using the clock module 106 disclosed by the present invention, the circuit module 102A generates a synchronous output clock 104C in the data path according to triggering of the clock 104A. Suppose that in the circuit module 102A three continuous data 112A, 114A, and 116A corresponding to one period T1 in data signals 110A are sent to the circuit module 102A. The circuit module 102A will make control signals 110A maintain a level H during three periods of T1 from time tb0 to tb12 in order to indicate three continuous data during time tb0 to tb12 in signals 110A. After data signals 110A and control signals 108A undergo an AND operation with the output clock 104C, the data signals 110B and 108B are generated. As shown in FIG. 12, data 112A, 114A, and 116A having one period T1 in signals 110A become data 112B, 114B, and 116B with half an period T1 in data signals 110B, so data 112B, 114B, and 116B can be seen as sub-data of half a period T1. Similarly, the control signals 108B maintain a level H only during times tb0 to tb2, tb4 to tb6, and tb8 to b10.

In the circuit module 102B, the control signal 108B and data signal 110B, after triggering by the flip-flops 140, become the control signal 108C and the data signal 110C. As shown in FIG. 11, three data 112B, 114B, and 116B in signal 110B are delayed by one period T1 after the flip-flops 140 to become data 112C, 114C, and 116C in the data signal 110C. Similarly, the level H part of the control signal 108B during times tb0 to tb2, tb4 to tb6, and tb8 to tb10 is delayed one period T4, and becomes the level H part of the control signal 108C during times tb1 to tb3, tb5 to tb7, and tb9 to tb11. After data signals 110B and 110C, control signals 108B and 108C undergo AND operations respectively, they become data signal 110D and control signal 108D. From FIG. 12, after three data 112B, 114B, and 116B in signal 110B and three data 112C, 114C, and 116C in signal 110C undergo the AND operation, they become three data 112D, 114D, and 116D in data signal 110D. These three data maintain precisely one period T4. Similarly, the control signal 108D maintains a level H only for a period T4 during times tb1 to tb2, tb5 to tb6, and tb9 to tb10. Thus, the circuit module 102B operating with the clock 104B of four times frequency correctly recognizes data 112D, 114D, and 116D in signal 110D as one data according to control signal 108D.

Figure 13:
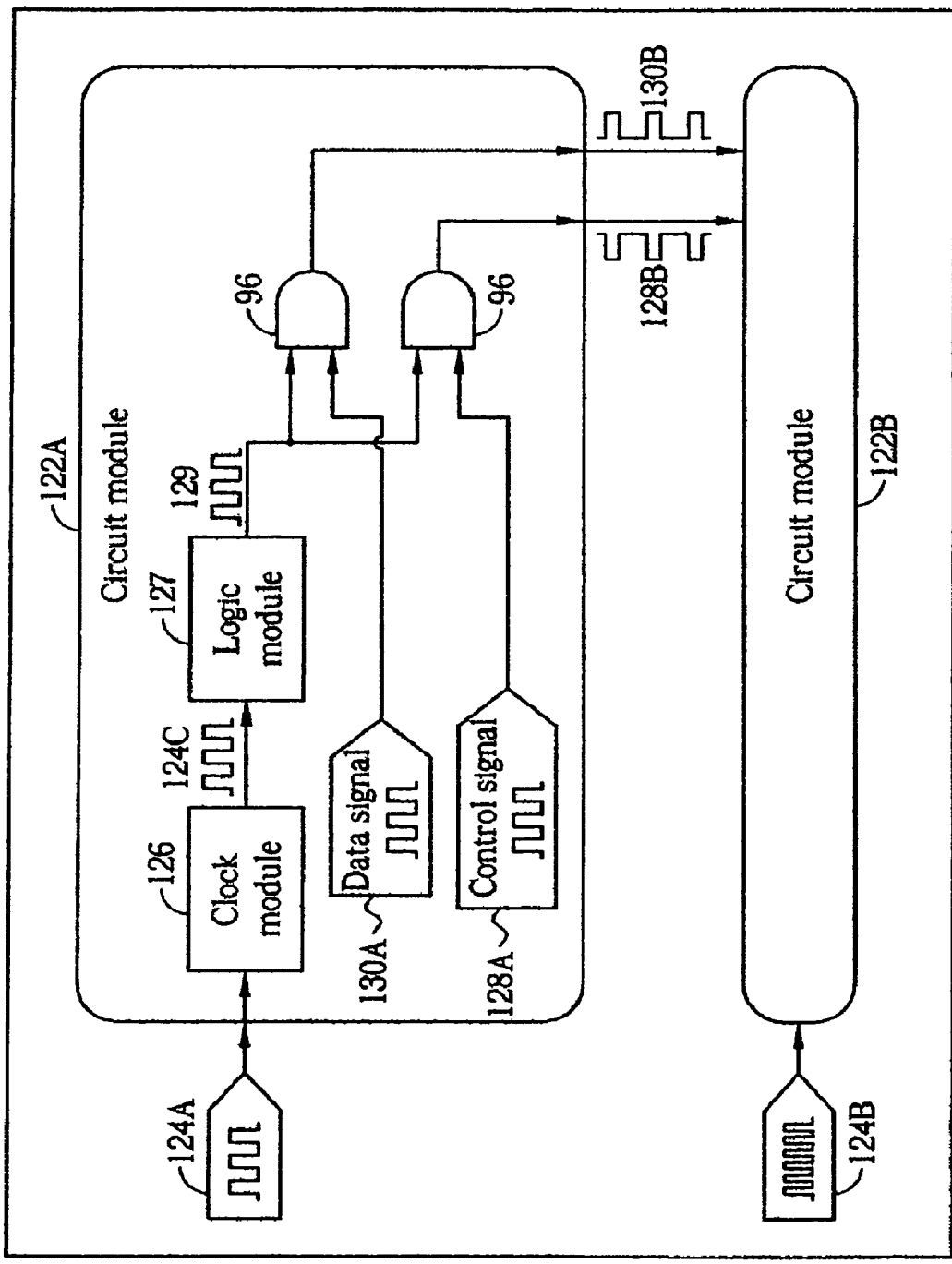
FIG. 13 illustrates function blocks of signals transformed between two circuit modules of different frequency in another signal circuit of the present invention.
Figure 14:
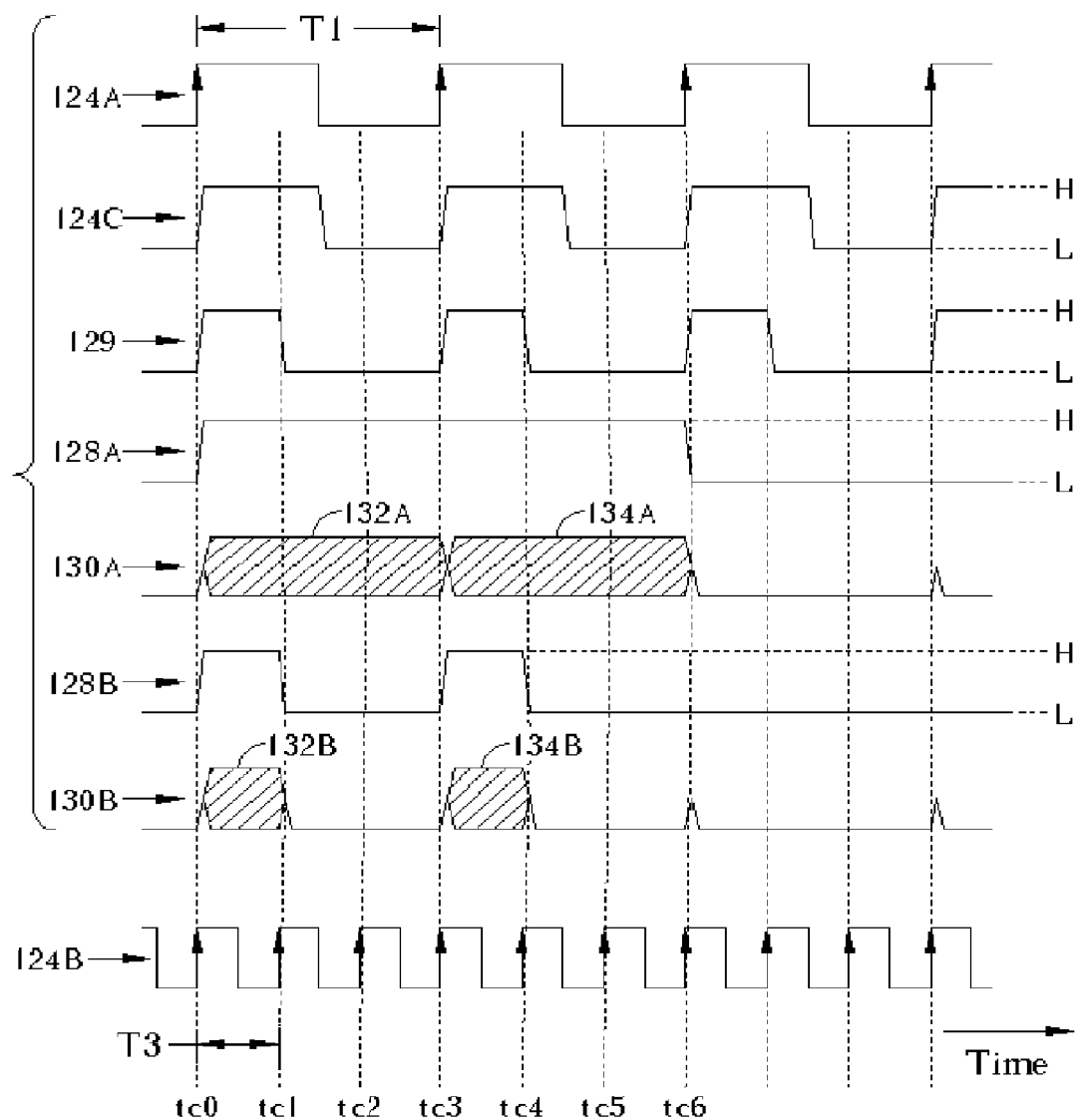
FIG. 14 is signal waveform-timing diagram of the signal circuit in FIG. 13.

Please refer to FIG. 13 and FIG. 14. FIG. 13 illustrates that two circuit modules 122A and 122B with different frequency in another signal circuit 120 of the present invention transform and process data between each other. FIG. 14 shows waveform-timing diagrams of each signal in FIG. 13. The x-axis of FIG. 14 represents time, and the y-axis represents signal level. In FIG. 13, a circuit module 122A operates with a clock 124A, and a circuit module 122B operates with a clock 124B whose frequency is three times that of the clock 124A. When the circuit module 122A transmits data signals 130A to the circuit module 122B, a clock module 126 can be set up in the circuit module 122A according to the method of the present invention to generate a corresponding output clock 124C in the data path according to the clock 124A. As described before, the output clock generated by the clock module 126 of the present invention can be used for logic operations, so in the circuit module 122A another logic module 127 generates a reference signal 129 of ⅓ duty cycle according to the clock 124C. FIG. 14 illustrates waveform timing diagrams of the clock 124A (output clock 126C) and the reference signal 129. After the data signal 130A and a corresponding control signal 128A undergo an AND operation with the reference signal 129 in AND gates 96, signal 130B and control signal 128B are generated, so the circuit module 122B operating at three times frequency can process data in the signal 130A correctly. The logic module 127 can be implemented by circuit combination. One of ordinary skill in the art can implement such circuits according to the present invention. Besides, the logic module 127 can be put into the clock module 126, and those skilled in the art can design suitable combinations in practical application.

As shown in FIG. 14, the clocks 124A and 124B are used to trigger the circuit module 122A, and their periods are T1 and T3 respectively. Because the frequency of the clock 124B is three times as much as that of the clock 124A, one period T1 covers three periods T3. By the clock module 126, the output clock 124C is generated according to the clock 124, and the logic module 127 generates the synchronous reference signal 129 according to the output clock 124C. Suppose that in the data signal 130A in the circuit module 122A, two data 132A and 134A corresponding to one period T1 are transmitted to the circuit module 122B. The circuit module 122A makes the control signal 128A maintain a level H during time tc0 to tc6 to indicate maintaining time of effective data in signal 130A. The control signal 128B and the data signal 130B are obtained after the control signal 128A and the data signal 130A undergo the AND operation with the reference signal 129. As shown in FIG. 14, in the data signal 130A two data 132A and 134A lasting for a period T1 become two data 132B and 134B lasting in a period T3 in the data signal 130B. Similarly, the level H part of the control signal 128A between two periods T1 becomes the level H part of the control signal 128B during time tc0 to tc1 and time tc3 to tc4. Continuation time of data 132B and 134B equals one period of the clock 124B, so the circuit module 122B can read the signal 130B correctly according to the control signal 128B.

In the prior art, because the clock in the clock path directly undergoes logic operations with signals in the data path, much difficulty in designing, simulating, and implementing circuits results. In some specific circuits, the clock in the clock path cannot be output by output pads directly, and this results in problems is some applications. Because in the prior art it is not suitable for the clock in clock path and data in data path to undergo logic operations directly, the prior art cannot process signals easily with its clocks, such as in the case of signal transformation between two circuits of different clock frequencies. Thus, methods of the prior art cannot process burst data. In comparison, the present invention first discloses generating a clock in the data path in FIG. 6 to FIG. 8 in order to use the clock to trigger flip-flops and produce data signals (such as an output clock) synchronous with the clock in data path. Because the present invention generates an output clock in the data path, circuit design, simulation, and implementation becomes easier. Even for some specific circuits that cannot output a clock directly through output pads, according to the present invention, an equivalent signal synchronously changing with the clock in the data path can be generated. Besides, the present invention further discloses in FIG. 9 to FIG. 14 how to use an output clock in the data path to transform and process data signals between circuit modules with different clock frequencies, so data signals can be correctly processed. Moreover, the methods of processing signals described above can also process burst data to increase the efficiency of signal transmission.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock circuit for generating an output clock in a data path according to a reference clock, in which there are signals of a plurality of periods, and each period of the signals has one rising edge and one falling edge, the clock circuit comprising:

a first flip-flop having a first clock port, wherein the first flip-flop generates a first signal according to triggering of the reference clock on the first clock port, and the first flip-flop changes a level of the first signal when each rising edge of reference clock occurs;

a second flip-flop having a second clock port, wherein the second flip-flop generates a second signal according to triggering of the reference clock on the second clock port, and the second flip-flop changes a level of the second signal when each falling edge of reference clock occurs; and a logic module comprising an XOR gate for generating the output clock according to results of an XOR operation between the first signal and the second signal.

2. The clock circuit in claim 1, wherein when the first flip-flop changes the level of the first signal at each rising edge of the reference clock, if the level of the first signal before the rising edge is a first level, the first flip-flop will change the level of the first signal to a second level after the rising edge.

3. The clock circuit in claim 2, wherein if the level of the first signal before the rising edge is the second level, the first flip-flop will change the level of the first signal to the first level after the rising edge.

4. The clock circuit in claim 1, wherein when the second flip-flop changes the level of the second signal at each falling edge of the reference clock, if the level of the second signal before the falling edge is a first level, the second flip-flop will change the level of the second signal to a second level after the falling edge.

5. The clock circuit in claim 4, wherein if the level of the second signal before the falling edge is the second level, the second flip-flop will change the level of the second signal to the first level after the falling edge.

6. The clock circuit in claim 1, wherein the clock circuit comprises a plurality of output pads to output signals of the clock circuit, and the reference clock is not output from any output pad.

7. A signal circuit, comprising:
a first circuit module for generating an output signal according to an input signal; the first circuit module comprising:
a first flip-flop having a first clock port, wherein the first flip-flop generates a first signal according to triggering of a reference clock on the first clock port, the reference clock comprising signals of a plurality of periods, each period of the signals having one rising edge and one falling edge, and the first flip-flop changes a level of the first signal when each rising edge of reference clock occurs;
a second flip-flop having a second clock port, wherein the second flip-flop generates a second signal according to triggering of the reference clock on the second clock port, and the second flip-flop changes a level of the second signal when each falling edge of reference clock occurs;
a first logic module for performing a logic operation on the first signal and the second signal to generate an output clock; and
a second logic module for performing a logic operation on the input signal and the output clock to generate the output signal.

8. The signal circuit in claim 7, wherein the input signal comprises a plurality of data and each data corresponds to one period of the reference clock.

9. The signal circuit in claim 7, wherein the second logic module performs an AND operation with the input signal and the output clock.

10. The signal circuit in claim 7, wherein when the first logic module generates the output clock, the output clock comprises a plurality of periods and each period of the output clock corresponds to one period of the reference clock so that the output clock is synchronous with the reference clock.

11. The signal circuit in claim 10, wherein to make each period of output clock correspond to one period of the reference clock, the level of the output clock in each period maintains a predetermined level during a predetermined time and the predetermined time is not longer than one period of the output clock.

12. The signal circuit in claim 11, wherein the input signal comprises a plurality of input data corresponding to one period of the reference clock, and that the second logic module performs the logic operation to make the output signal have a plurality of output data, wherein each output data corresponds to one period of the output clock.

13. The signal circuit in claim 12, wherein each output data has a first output sub-data and a second output sub-data, and each content of the first output sub-data corresponds to one of the input data, and a continuation time of each second output sub-data corresponds to the predetermined time in one period of the output clock.

14. The signal circuit in claim 13, comprising:
a second circuit module for receiving the output signal according to triggering of a second reference clock;
wherein the second reference clock comprises a plurality of periods, and when the second logic module makes each first output sub-data correspond to one of the input data, the continuation time of the first output sub-data corresponds to one period of the second reference clock.

15. The signal circuit in claim 14, wherein when the second logic module makes each second output sub-data correspond to the predetermined time in one period of the input data, the continuation time of the second output sub-data corresponds to at least one period time of the second reference clock.

16. A method of generating an output clock in a data path according to a reference clock, the method comprising:
generating a first signal according to triggering of the reference clock so as to change a level of the first signal at each rising edge of the reference clock;
generating a second signal according to triggering of the reference clock so as to change a level of the second signal at each falling edge of the reference clock; and
performing an XOR operation on the first signal and the second signal to generate the output clock.

17. The method in claim 16, wherein when the level of the first signal is changed at each rising edge of the reference clock, if the level of the first signal before the rising edge is the first level, the level of the first signal is changed to the second level after the rising edge.

18. The method in claim 17, wherein if the level of the first signal before the rising edge is the second level, the level of the first signal is changed to the first level after the rising edge.

19. The method in claim 16, wherein when the level of the second signal is changed at each falling edge of the reference clock, if the level of the second signal before the falling edge is the first level, the level of the second signal is changed to the second level after the falling edge.

20. The method in claim 19, wherein if the level of the second signal before the rising edge is the second level, the level of the second signal is changed to the first level after the rising edge.

21. The method in claim 16 further comprising generating a reference signal by using a ratio between the period of the first signal and that of the second signal before generating the output clock so that a duty cycle of the reference signal is different from that of the output clock.

* * * * *